VOLTAGE CONTROLLED CAPACITANCE DIODE TUNER
WITH TEMPERATURE COMPENSATION

Filed Nov. 30, 1962

INVENTOR.
GERHARD B. DENKER
BY Alden D. Redfield
Irwin P. Garfinkle
ATTORNEYS.

United States Patent Office 3,204,207
Patented Aug. 31, 1965

3,204,207

VOLTAGE CONTROLLED CAPACITANCE DIODE TUNER WITH TEMPERATURE COMPENSATION

Gerhard B. Denker, Cincinnati, Ohio, assignor to Avco Corporation, Cincinnati, Ohio, a corporation of Delaware Filed Nov. 30, 1962, Ser. No. 241,272
5 Claims. (Cl. 334—15)

This invention relates to a system for electronically tuning radio frequency filters, and more particularly to a tuner or filter utilizing the variable capacity characteristics of a back biased semiconductor diode and to means for stabilizing the capacity characteristics of diodes under varying environmental conditions.

In the electronically tuned filter of this invention, the capacity characteristics of a back biased semiconductor diode are used in combination with an inductor for determining frequency of operation. The capacity characteristics of the semiconductor, and hence the frequency of operation is established by applying a predetermined voltage back bias across the diode junction. To avoid frequency drift, it is necessary to main a constant back bias for any given frequency setting, but in a practical case the voltage across a semiconductor diode junction may vary over a wide range due to environmental changes, and for that reason some method of stabilization must be incorporated in the tuning system. The present invention provides very simple, precise and economical means.

Certain types of semiconductor diodes show appreciable capacitance across their barrier junction when biased into a nonconducting region. The valve of capacitance of such a diode varies with the degree of applied bias, the capacity vs. voltage characteristic approximating an exponential relationship; however, even presumably identical diodes will vary widely in characteristic as to capacity-voltage ratios, leakage, and other working environmental reactions. Since in many applications it is necessary to parallel many such diodes to obtain the necessary amount of capacity, some means must be used for stabilizing the back bias voltage in spite of the variables among the diodes.

The major problems to be overcome are the leakage current variations resulting from increases in temperature and further the increments in voltage across the diode junction produced by increases in temperature, e.g. approximately 2 millivolts per degree centigrade.

The primary object of this invention is to maintain constant the capacity characteristics of a single semiconductor diode, or a plurality of parallel connected diodes irrespective of environmental or other undesired changes.

Another object of this invention is to maintain a constant back biasing voltage across the diode junction of a semiconductor diode so as to maintain a constant capacity characteristic irrespective of changes in leakage resistance and/or temperature.

Still another object of this invention is to provide a voltage stabilized transistor drive for maintaining a constant back biasing voltage across the diode junction of a semiconductor diode irrespective of change in current flow through the diode.

Still another object of this invention is to provide a voltage stabilized transistor drive for maintaining a constant back bias across the diode junctions of a plurality of parallel and/or series connected diodes irrespective of change in current flow through the diode.

For further objects and advantages of this invention, reference should be made to the accompanying drawings in which.

Figures 1, 2, 3:
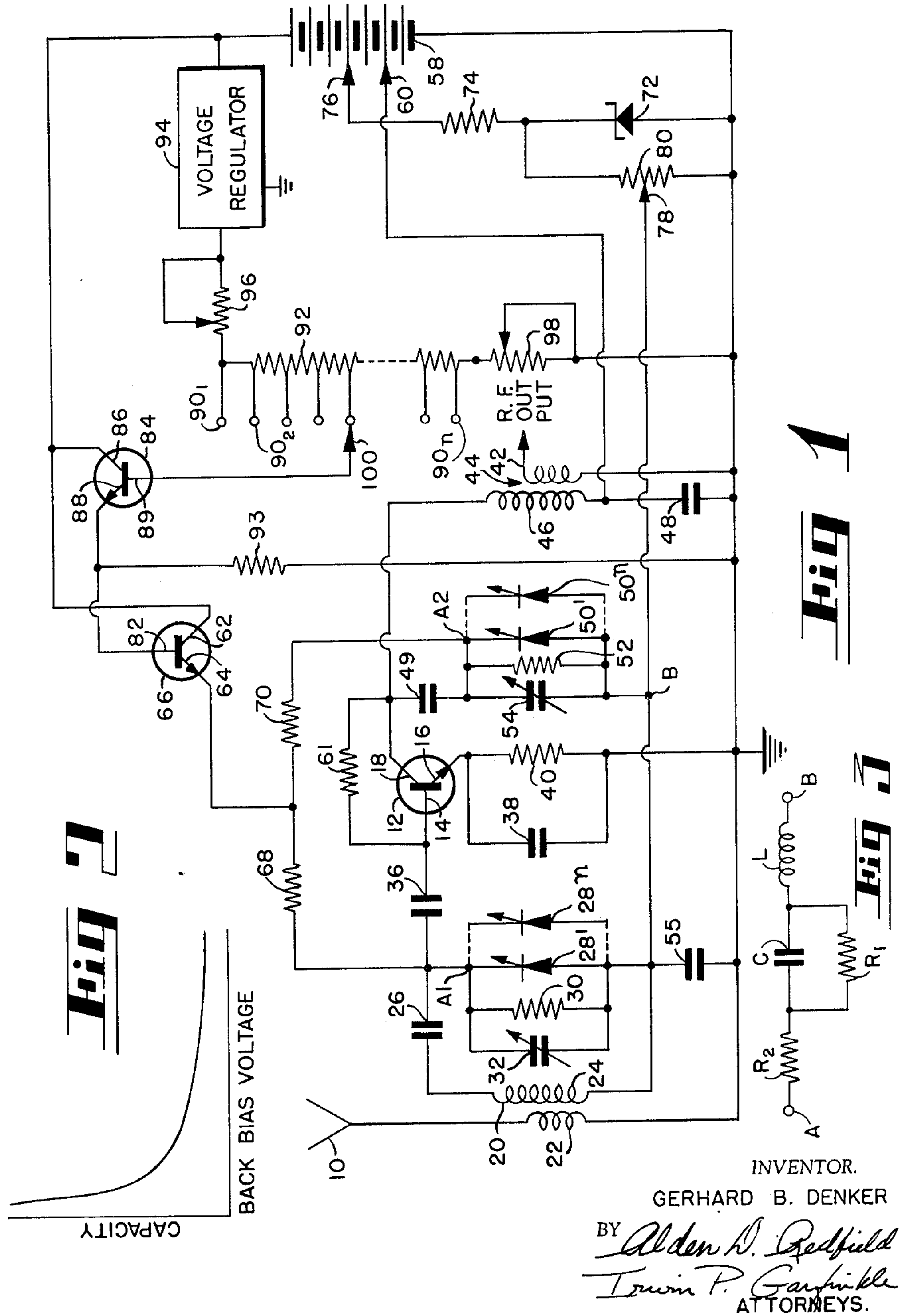
FIGURE 1 is a schematic representation of a radio frequency stage of a receiver incorporating this invention.
FIGURE 2 is a curve representing the voltage-capacity characteristics of a typical, back biased semiconductor diode.
FIGURE 3 represents the equivalent electrical circuit of a typical back biased semiconductor diode.

The circuit shown in FIGURE 1 illustrates a practical embodiment of the invention incorporating a transistorized tuned radio frequency stage of the type which may be used to couple a receiving antenna 10. The use of the invention in either a communications receiver or a transmitter or in any other tuned filter application will be obvious to persons skilled in the art, the description being limited for simplicity to a receiver. The radio frequency stage includes an NPN-type transistor-amplifier 12 having a base 14, an emitter 16, and a collector 18. Radio frequency signals received at the antenna 10 are coupled to the radio frequency input circuit of the transistor 12 through an antenna transformer 20 having a primary winding 22 and a secondary winding 24. The secondary winding 24 in series with a capacitor 26 is tuned by means of semiconductor diodes $28^1$–$28^n$ across which are connected a resistor 30 and a trimmer capacitor 32. While only two parallel connected diodes $28^1$ and $28^n$ are illustrated, it will be understood that any number $n$ of substantially identical diodes 28 may be used depending on capacity and other requirements. In some cases 100 or more may be needed. In other cases, series and parallel combinations of diodes may be used. The alternating current signals developed across the tuned network are applied through a capacitor 36 to the base 14 of transistor 12, the emitter 16 being connected to ground for alternating currents through a capacitor 38 and for direct currents through an emitter-resistor 40. The amplified radio frequency output is derived from the secondary winding 42 of transformer 44, the primary winding 46 of which is connected between the collector 18 and ground by means of a capacitor 48.

The primary winding 46 of output transformer 44 is tuned by means of a variable capacitance network including a fixed capacitor 49 in series with tunable semiconductor diodes $50^1$–$50^n$, across which a leakage resistance 52 and a trimmer capacitor 54 are connected. The diodes 50 will constitute a plurality similar to that of the diodes 28, and all are tuned in a manner hereinafter to be explained by the application of a direct voltage to the anode junctions A1 and A2, the cathode junction B being maintained at an adjustably fixed level. A D.C. blocking capacitor 55 provides an alternating current connection to ground.

Direct current bias for the collector emitter electrodes of transistor 12 is derived from a battery 58 or other conventional source at a tap 60 and through the primary 46 of transformer 44. The resistor 61 provides a negative feedback path from collector 18 to base 16.

The invention concerns the manner in which the voltage between the junctions A1 and A2 of the anodes of the diodes and the junction B at the cathodes are regulated to maintain constant capacity for a given setting. Before proceeding to the description of the circuitry, it would be appropriate to point out the various problems by reference to FIGURES 2 and 3. FIGURE 2 shows the back bias voltage vs. capacity characteristics of a typical diode $28^1$–$28^n$ or $50^1$–$50^n$. It will be observed that capacity decreases with increases in applied back biasing potential across the diode junction. As will be explained in reference to FIGURE 3, the voltage across the diode junction is not the same as the voltage applied across the terminals of the diode unit. It is also a characteristic that changes in leakage currents through a diode do not affect capacity, provided the back bias voltage at the diode junction is maintained at a constant level. It is another characteristic that the voltage across the diode junctions of diodes 28 and 50 will vary with temperature, and hence produce capacity variations.

The problems created by the characteristics of the diodes will best be understood by reference to the equivalent diode circuit shown in FIGURE 3. It will be noted that each diode comprises the equivalent of the combination of a capacitor C in parallel with a leakage resistor $R_1$, and in series with a leakage resistor $R_2$ and an inductor L. The electrodes of the capacitor represent the diode junction across which the voltage must be regulated to maintain a constant capacity. In practical cases, L is so small that it may be neglected. However, $R_1$ and $R_2$ comprise a non-linear voltage divider across the electrodes of the capacitor C. The voltage across leakage resistor $R_1$, which is equal to the voltage across the diode junction, varies for two causes. First, a variation in temperature produces a variation in potential at the diode junction; and second, variations in leakage resistance of $R_1$ and $R_2$ vary the current through the resistors, to change the voltage across $R_1$. This invention provides means for automatically compensating for variations in diode junction voltage due to both causes. For additional data relative to the characteristic of the diodes, reference may be made to the article entitled "A Variable Semiconductor Capacitor" by Adams and Stearn appearing on page 733 of the November 1962 issue of Electronic Engineering, a British publication.

The arrangement for establishing the back biasing potential across the various semiconductor diodes 28 and 50 includes the battery 58, the positive terminal of which is connected to the anode junctions A1 and A2 through the collector and emitter electrodes 62 and 64 of NPN type transistor 66, and through resistors 68 and 70, respectively. Also provided is a second NPN type transistor 84 having a collector 86 connected to the battery 58, an emitter 86 connected to the base 82 of transistor 66 and to ground through a resistor 93, and a base 89 connected to any selected one of a plurality of terminals $90_1$–$90_n$ on a voltage dividing resistor 92. A regulated voltage from regulator 94 is applied across the resistor 92. The regulator 94 is conventional and is shown only in block diagram form. The function of regulator 94 is to provide a constant current through resistor 92. The regulator 94 may be of a very simple type since there is essentially no drain on the resistor 92 from the base 89. The resistors 96 and 98 serve as trimmers in conjunction with the resistor 80 to adjust the temperature compensation network of the system. The position of a tap 100 with respect to the terminals 90 is used to set up any preselected frequency within the range of operation of the diodes 28 and 50. The voltage established at the junctions A1 and A2 depends on the voltage applied to the base 82 through the base-emitter junction of transistor 66 from the tap 100. For establishing the voltage at the cathode junction B, a Zener diode 72 in series with a resistor 74 is connected across a portion of the battery 58 by means of an adjustable tap 76. The junction B is connected by means of a movable tap 78 to a resistor 80 connected across the Zener diode 72.

An appropriate operating bias for transistor 12 is established at the tap 60, and thereafter the voltages at the junctions A1 and A2 are set for operation at a particular frequency by the selective positioning of the tap 100 on resistor 92. Since the voltage across resistor 92 is regulated, the voltage at base 89 of transistor 84 is essentially constant for a particular frequency setting at a given temperature and other given environmental conditions. Moreover, the voltage drop across the base-emitter junctions of each of the transistors 84 and 64 is predictable for any given temperature, and hence the voltages at A1 and A2 as well as across the diode junctions (across resistor $R_1$ in FIGURE 3), is established for a selected capacity. The collector voltage from the battery 58 need not be regulated, since the voltages across the junctions of diodes 28 and 50 are established through the base-emitter circuits of the transistors.

As previously noted, a variation in temperature creates a change in voltage across the diode junctions of diodes 28 and 50, and hence a capacity change is produced. The particular diodes used had positive temperature coefficients, that is, an increase in temperature increased voltage. To compensate for the temperature coefficient each diode has been effectively included in a series loop comprising the base-emitter diode junction of each of the transistors 66, 84 and the Zener diode 72. Now the transistors 66 and 84 were selected so that the base-emitter diode junctions exhibited compensating temperature coefficients; that is to say, in the particular case shown the temperature coefficient was negative so that the voltages across the base emitter junctions go down with increase in temperature. Since any changes in voltage due to temperature variation resulting across the base-emitter junction of transistor 84 is added to the change in the base-emitter portion of the transistor 66, the positive changes in voltage across the diodes 28 and 50 are effectively over-ridden by the negative changes in the transistor 66. The Zener diode is selected so as to exhibit a positive temperature coefficient. The appropriate positioning of the tap 78 across a portion of the Zener diode 72, produces an equalizing voltage change tending to cancel the voltage changes in the other junctions due to temperature. It has been found that the changes in each of the diodes, though different, are approximately linear, and hence once adjusted there is automatic compensation. Because the combined effects of the transistors 66 and 84 are used in combination with the Zener diode 72 to compensate for the change in voltage of the diodes 28 and 50, no individual component is critical, and all necessary circuit adjustments, in so far as temperature coefficients are concerned, may be made at the taps 78, 96 and 98.

Consider next the operation of the system with respect to its capability for automatic compensation for changes in leakage resistance. For a given setting of the tap 100, and at a given temperature, the transistor 84 is established at given base-emitter potential, and the transistor 66 is therefore also set at a given level, thus establishing the selected operating voltage level at junctions A1 and A2. The voltage at junction B having been adjusted for a given coefficient of temperature compensation by positioning of the taps 78 on resistor 80 across the Zener diode 72 and at taps 96 and 98, each of the junctions of diodes 28 and 50 is back biased an amount to provide the selected capacity.

If the leakage resistance (resistor $R_1$ and $R_2$) in one or more of the diodes 28 and 50 varies, assume a decrease in resistance, then the voltage drop across each of the diode junctions also decreases, and the capacity of the diodes tends to change in accordance with the curve of FIGURE 2. However, the voltage drop resulting at junctions A1 and A2 produces a voltage drop at the emitter 64 of transistor 66, thus increasing base-emitter drive. An increase in base-emitter drive results in increased current flow from the battery 58 through the collector-emitter junction and the diodes 28 and 50, thereby increasing the current flow through the leakage resistor $R_1$ and $R_2$ to restore the voltages across the diode junctions to the original setting. Moreover, there is also a variation in transistor diode currents flowing through resistor 93, and this serves to elevate the base 82, thereby further enhancing current flow through the diodes 28 and 50.

The action of the system is self regulatory since the increase in voltage across the diodes 28 and 50, resulting from increased current flow re-elevates the emitter 64 tending to reduce conduction, and an increase in voltage across resistor 93 serves to elevate the emitter 88 of transistor 84 tending to reduce conduction through it to reduce the forward bias on transistor 66. Thus, there are opposing factors tending to "see-saw" the transistor 66 for operation at a constant potential irrespective of the increased current flow necessary to compensate for decreases in leakage impedance.

While I do not wish to be limited to precise parameters, the following circuit parameters were incorporated in an embodiment of this invention successfully reduced to practice, and are listed below for the purpose of better enabling persons skilled in the art to exercise the invention:

| | |
|---|---|
| Capacitors: | |
| **26** | .001 $\mu$f. |
| **32** | 2–8 $\mu\mu$f. |
| **36** | .001 $\mu$f. |
| **38** | .001 $\mu$f. |
| **48** | .01 $\mu$f. |
| **49** | .001 $\mu$f. |
| **54** | 2–8 $\mu\mu$f. |
| **55** | .01 $\mu$f. |
| Resistors: | |
| **30** | 10 megohms. |
| **40** | 47 ohms. |
| **52** | 10 megohms. |
| **61** | 330K ohms. |
| **68** | 100K ohms. |
| **70** | 100K ohms. |
| **74** | 3K ohms. |
| **80** | 18K ohms. |
| **92** | 1 megohm. |
| **93** | 10 megohms. |
| **96** | 50K ohms. |
| **98** | 50K ohms. |
| Transistors: | |
| **12**, **16**, and **84** | Type 2N910. |
| Zener diode **72** | Type TMD–16A. |
| Diodes: | |
| **28** | Type L6502—Philco. |
| **50** | Type L6502—Philco. |
| Battery **58** | 125 volts. |
| Taps: | |
| **60** | At 9 volts. |
| **76** | At 22 volts. |

There has been described a network which compensates for the changes in leakage resistance or for voltage variation due to changes in temperature or from any other cause. The system tends to maintain a fixed voltage drop at the position set by the tap 100 regardless of current demand within its operable region. In addition, the stabilized high impedance operation provided by the circuitry offers attractive operating economy. Control currents are reduced to the order of micro amps while currents running well up into the milliampere range normally would be expected in a network of this effectiveness. The novel circuitry described permits wide latitude in application with broad compensation potential.

Having described a preferred embodiment of this invention, I claim:

1. A temperature-compensating network for a variable-capacity semiconductor diode having a temperature coefficient of one polarity, comprising:
   - first and second transistors each having a base, an emitter, and a collector, the diode junction between the base and emitter of each of said transistors having a temperature coefficient of compensating polarity to said variable-capacity diode, said collectors being interconnected, the emitter of said first transistor being connected to the base of the second transistor, and said diode being connected between the emitter of the second transistor and a point of reference potential;
   - a two-terminal source of unregulated biasing voltage for said transistors, one of said terminals being connected to said collectors, the other being connected to said point;
   - a two-terminal source of regulated voltage, one of said terminals being connected to the base of said first transistor, the other of said terminals being connected to said point;
   - whereby said variable-capacity diode, said transistor diode junctions, and said regulated two-terminal source are effectively connected in a series loop.

2. The invention as defined in claim 1, and a Zener diode having a temperature coefficient of said one polarity, said Zener diode being effectively connected to said variable-capacity diode in said series loop.

3. The invention as defined in claim 1 wherein said variable capacity semiconductor diode comprises the variable capacitance in a tunable inductance capacitance resonant circuit.

4. The invention as defined in claim 1, and another semiconductor diode having a temperature coefficient of said one polarity, said another semiconductor diode being effectively connected to said variable capacity diode and in said series loop.

5. The invention as defined in claim 1 wherein a resistor is connected across said another diode, and wherein said another diode is effectively connected in said series loop through said resistor.

References Cited by the Examiner

UNITED STATES PATENTS 3,099,798 7/63 Miller ---------------- 307—88.5

OTHER REFERENCES

McMahon et al.: Voltage-Variable Capacitors—State of Art, page 93, Electronic Industries, December 1959.

HERMAN KARL SAALBACH, *Primary Examiner.*